US012629772B2

(12) United States Patent
Koerwer

(10) Patent No.: US 12,629,772 B2
(45) Date of Patent: May 19, 2026

(54) LASER PROCESSING MACHINE

(71) Applicant: DISCO CORPORATION, Tokyo (JP)

(72) Inventor: Joel Koerwer, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 538 days.

(21) Appl. No.: 17/664,455

(22) Filed: May 23, 2022

(65) Prior Publication Data

US 2022/0379401 A1 Dec. 1, 2022

(30) Foreign Application Priority Data

May 28, 2021 (JP) ................................. 2021-090132

(51) Int. Cl.
B23K 26/064 (2014.01)
B23K 26/0622 (2014.01)
B23K 26/08 (2014.01)
B23K 26/082 (2014.01)
B23K 26/12 (2014.01)
H10P 72/00 (2026.01)

(52) U.S. Cl.
CPC ...... B23K 26/0648 (2013.01); B23K 26/0622 (2015.10); B23K 26/082 (2015.10); B23K 26/127 (2013.01); H10P 72/0428 (2026.01); B23K 26/0853 (2013.01)

(58) Field of Classification Search
CPC .............. B23K 26/0648; B23K 26/082; B23K 26/0643; B23K 26/0821; B23K 26/0622; B23K 26/00
See application file for complete search history.

(56) References Cited

U.S. PATENT DOCUMENTS

| | | | |
|---|---|---|---|
| 6,353,203 B1* | 3/2002 | Hokodate | ............ B23K 26/032 |
| | | | 219/121.75 |
| 2002/0153361 A1* | 10/2002 | Sakamoto | .......... B23K 26/0608 |
| | | | 219/121.73 |
| 2005/0006361 A1 | 1/2005 | Kobayashi et al. | |

(Continued)

FOREIGN PATENT DOCUMENTS

| | | |
|---|---|---|
| DE | 197 82 307 T5 | 7/1999 |
| DE | 10 2004 033 151 A1 | 3/2005 |

(Continued)

OTHER PUBLICATIONS

Kweon, G;. "English Machine Translation of KR-20140088839-A". 2025. EPO. Espacenet. (Year: 2025).*

(Continued)

*Primary Examiner* — Susan D Leong
*Assistant Examiner* — Jonathan B Woo
(74) *Attorney, Agent, or Firm* — GREER BURNS & CRAIN, LTD.

(57) ABSTRACT

A laser beam application unit of a laser processing machine includes a laser oscillator that emits a laser beam, an fθ main lens that focuses and applies the laser beam which has been emitted from the laser oscillator, to a workpiece held on a holding table, a scan unit that is arranged on an optical path between the laser oscillator and the fθ main lens, scans the laser beam, and guides the resulting scanned laser beam to the fθ main lens, and an fθ sub-lens that is arranged on the optical path between the laser oscillator and the scan unit and converts the laser beam from parallel light into diffused light.

6 Claims, 3 Drawing Sheets

(56)                 References Cited

U.S. PATENT DOCUMENTS

| | | | |
|---|---|---|---|
| 2005/0218128 A1 | 10/2005 | Han | |
| 2007/0278194 A1 | 12/2007 | Hoelsher et al. | |
| 2015/0251272 A1 | 9/2015 | Sieben et al. | |
| 2016/0045980 A1* | 2/2016 | Asano | B23K 26/705 |
| | | | 219/121.74 |
| 2018/0342397 A1* | 11/2018 | Ikenoue | H10P 32/16 |
| 2019/0105734 A1 | 4/2019 | Hadano et al. | |
| 2019/0122907 A1* | 4/2019 | Hadano | H10P 72/0428 |
| 2019/0193197 A1 | 6/2019 | Ishikawa et al. | |
| 2020/0276668 A1* | 9/2020 | Stürmer | B23K 26/046 |
| 2020/0341379 A1* | 10/2020 | Kato | G03F 7/2006 |
| 2021/0364769 A1* | 11/2021 | Aslanov | B23K 26/0643 |
| 2024/0416449 A1* | 12/2024 | Egami | B23K 26/082 |

FOREIGN PATENT DOCUMENTS

| | | | |
|---|---|---|---|
| DE | 60 2004 009 754 T2 | 8/2008 | |
| DE | 10 2018 217 293 A1 | 4/2019 | |
| DE | 11 2017 004 557 T5 | 5/2019 | |
| EP | 1 716 963 A1 | 11/2006 | |
| JP | 2005064231 A | 3/2005 | |
| JP | 2009208093 A | 9/2009 | |
| JP | 2010082663 A | 4/2010 | |
| JP | 2015535747 A | 3/2014 | |
| JP | 2016068149 A * | 5/2016 | B23K 26/0821 |
| KR | 20140088839 A * | 7/2014 | G02B 26/10 |
| KR | 10 1 542 680 B1 | 7/2015 | |
| WO | 2006015795 A1 | 2/2006 | |
| WO | 2014/107036 A1 | 7/2014 | |
| WO | WO-2018066285 A1 * | 4/2018 | G02B 26/12 |

OTHER PUBLICATIONS

Kato M. "English machine translation of WO-2018066285-A1." EPO. Espacenet. (Year: 2026).*

Nomaru K. "English machine translation of JP-2016068149-A." EPO. Espacenet. (Year: 2026).*

Office Action issued by the JP Patent Office in corresponding Patent Application No. 2021-090132, dated Sep. 5, 2024.

Office Action issued by the German Patent Office for corresponding Patent Application No. 10 2022 205 061.4, mailed Apr. 17, 2025.

* cited by examiner

LASER PROCESSING MACHINE

BACKGROUND OF THE INVENTION

Field of the Invention

The present invention relates to a laser processing machine.

Description of the Related Art

As a method for dividing a semiconductor wafer, on a front surface of which a function layer including a low-k film or the like is stacked, into device chips, there has been proposed a processing method that applies a laser beam to remove the stacked function layer and then divides the wafer by cutting operation with a cutting blade (see JP 2005-064231A).

However, this method requires to repeatedly apply the laser beam along each scribe line (hereinafter called "street") to form a processed groove with a sufficient width in order to prevent melt of debris and the like occurred by the application of the laser beam from flowing back into the processed groove without sufficient evacuation, and therefore has a problem of low productivity.

To solve this problem, there has been developed a laser processing machine that can apply efficient processing while preventing melt from flowing back into processed grooves, by arranging a scanning optical system, which scans a laser beam, between a laser oscillator and a condenser and applying the laser beam while scanning it in a Y-axis direction (a width direction of the processed groove) and an X-axis direction (a processing feed direction) (see JP 2016-068149A).

SUMMARY OF THE INVENTION

When processing is applied while a laser beam is scanned as in the above-mentioned laser processing machine, an fθ lens is generally used as a condenser. Here, the fθ lens is smeared due to scattering of melt of debris and the like if the distance from the fθ lens to a processing point is short. It is therefore required to increase the distance from the fθ lens to the processing point, in other words, to position a back focal point of the fθ lens at a location as far as possible from the fθ lens.

To make the laser beam incident vertically on a wafer, on the other hand, there is a need to arrange a scan mirror of a scanning optical system at the position of a front focal point of the fθ lens. If the distance between the fθ lens and the scan mirror is close, however, the fθ lens may be caused to vibrate by high-speed drive of the scan mirror. It is hence preferred to also position the front focal point at a location as far as possible from the fθ lens.

However, their simultaneous realization is difficult, resulting in a physical limitation. An approach was hence contemplated to increase the distance between the fθ lens and the scan mirror by forming an intermediate image. The fθ lens itself however increased in size, raising another problem of upsizing of the machine.

The present invention therefore has as an object thereof the provision of a laser processing machine that can make a laser beam incident vertically on a workpiece while minimizing upsizing of the machine and suppressing smearing of a lens with debris.

In accordance with an aspect of the present invention, there is provided a laser processing machine including a holding table that holds a workpiece thereon, a laser beam application unit that applies processing to the workpiece by focusing and applying a pulsed laser beam to the workpiece held on the holding table, and a moving unit that relatively moves the holding table and a focal point of the laser beam. The laser beam application unit includes a laser oscillator that emits the laser beam, an fθ main lens that focuses and applies the laser beam which has been emitted from the laser oscillator, to the workpiece held on the holding table, a scan unit that is arranged on an optical path between the laser oscillator and the fθ main lens, scans the laser beam, and guides the resulting scanned laser beam to the fθ main lens, and an fθ sub-lens that is arranged on the optical path between the laser oscillator and the scan unit and converts the laser beam from parallel light into diffused light.

Preferably, the scan unit may include a scan mirror on which the laser beam is incident from the fθ sub-lens, and the fθ main lens may have a front focal point positioned on the scan mirror.

Preferably, the fθ main lens and the fθ sub-lens may be incorporated as a unit with distances and positions thereof fixed relative to the scan unit.

Preferably, the laser beam application unit may include a chamber, the scan unit may be disposed within the chamber, and the fθ main lens and the fθ sub-lens may each be disposed in a form of a window that isolates an inside of the chamber and a surrounding environment from each other while allowing transmission of the laser beam therethrough.

According to the present invention, it is possible to make a laser beam incident vertically on a workpiece while minimizing upsizing of a laser processing machine and suppressing smearing of a lens with debris.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

With reference to the attached drawings, a description will be made in detail about an embodiment of the present invention. However, the present invention shall not be limited by details that will be described in the subsequent embodiment. The elements of configurations that will hereinafter be described include those readily conceivable to persons skilled in the art and substantially the same ones. Further, the configurations that will hereinafter be described can be combined appropriately. Further, various omissions, replacements, and modifications of configurations can be made without departing from the spirit of the present invention.

Figure 1:
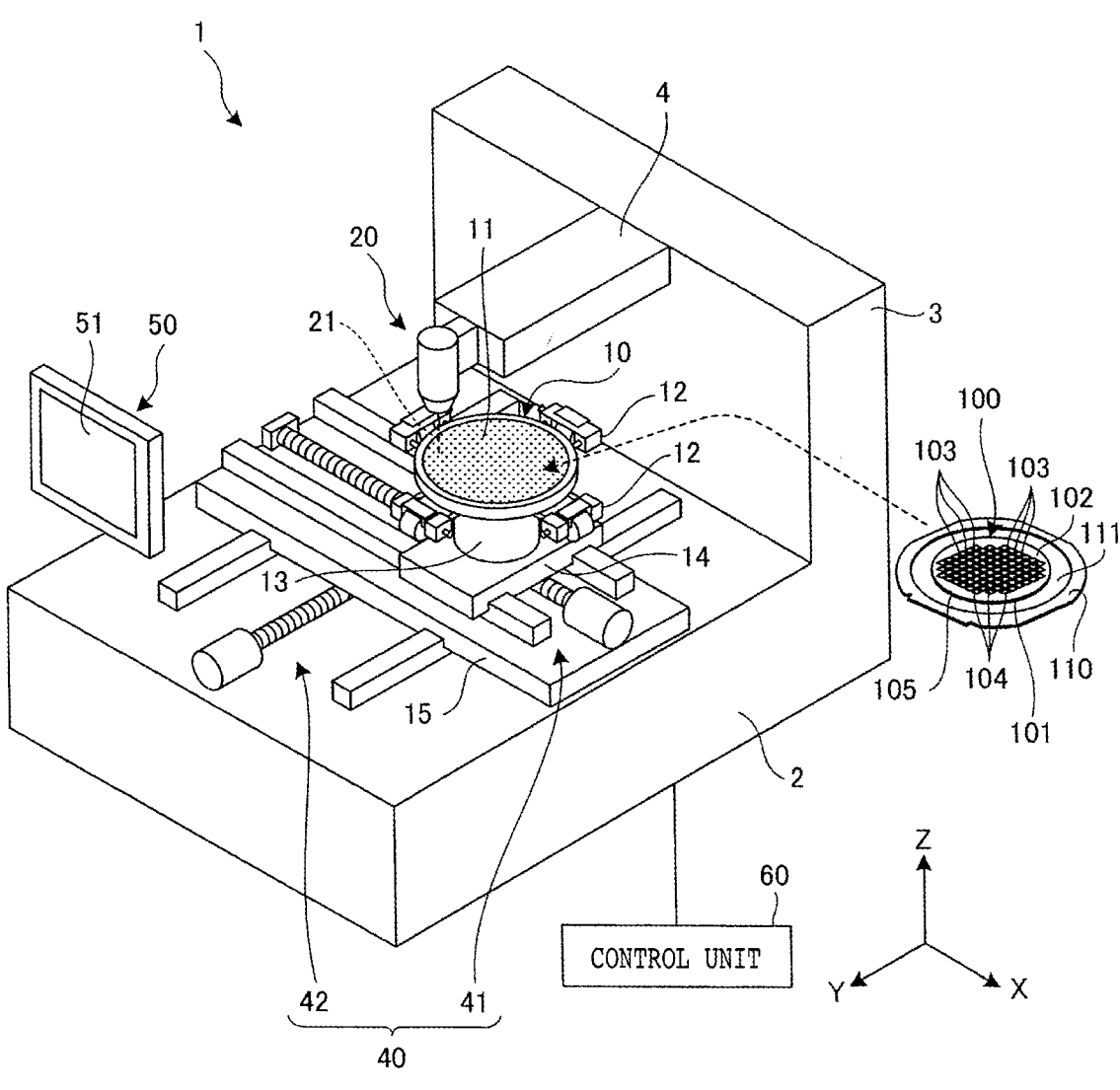
FIG. 1 is a perspective view illustrating a configuration example of a laser processing machine according to an embodiment of the present invention.

Based on FIG. 1, a description will first be made about a configuration of a laser processing machine 1 of this embodiment. FIG. 1 is a perspective view illustrating a configuration example of the laser processing machine 1 of this embodiment. In the following description, an X-axis direction is a direction in a horizontal plane. A Y-axis direction is a direction that is orthogonal to the X-axis direction in the horizonal plane. A Z-axis direction is a direction that is orthogonal to the X-axis direction and the Y-axis direction. In the laser processing machine 1 of this embodiment, a processing feed direction is the X-axis direction, while an indexing feed direction is the Y-axis direction.

As illustrated in FIG. 1, the laser processing machine 1 includes a holding table 10, a laser beam application unit 20, a moving unit 40, a display unit 50, and a control unit 60. The laser processing machine 1 of this embodiment processes a workpiece 100 held on the holding table 10, by applying a pulsed laser beam 21 to the workpiece 100 from the laser beam application unit 20. The processing of the workpiece 100 by the laser processing machine 1 is, for example, groove processing that forms grooves in a surface of the workpiece 100, cutting processing that cuts the workpiece 100 along streets, or like processing.

In this embodiment, the workpiece 100 is a wafer such as a disc-shaped semiconductor device wafer or an optical device wafer, which uses, as a substrate 101, silicon (Si), sapphire (Al$_2$O$_3$), gallium arsenide (GaAs), silicon carbide (SiC), lithium tantalate (LiTa$_3$), or the like. It is to be noted that the workpiece 100 is not limited to the one of this embodiment and may have a shape other than a disc shape.

The workpiece 100 has streets 103 set in a grid pattern on a front surface 102 of the substrate 101 and devices 104 formed in regions defined by the streets 103. The devices 104 are, for example, integrated circuits (ICs) such as general ICs or large scale integration (LSI) circuits, or image sensors such as charge coupled devices (CCDs) or complementary metal oxide semiconductors (CMOS). For example, an adhesive tape 111 has a larger diameter than an outer diameter of the workpiece 100, and carries an annular frame 110 bonded thereto. The adhesive tape 111 is bonded to a back surface 105 of the workpiece 100, whereby the workpiece 100 is supported in an opening of the frame 110.

The holding table 10 supports the workpiece 100 on a holding surface 11. The holding surface 11 has a disc shape, and is made from porous ceramics or the like. In this embodiment, the holding surface 11 is a plane parallel to a horizontal direction. The holding surface 11 is connected, for example, to a vacuum suction source via a vacuum suction path. The holding table 10 holds under suction the workpiece 100 that is placed on the holding surface 11. Around the holding table 10, a plurality of clamp portions 12 is disposed to clamp the frame 110 with the workpiece 100 supported thereon.

The holding table 10 is rotated by a rotation unit 13 about an axis of rotation which is parallel to the Z-axis direction. The rotation unit 13 is supported on an X-axis direction moving plate 14. The rotation unit 13 and the holding table 10 are moved in the X-axis direction by an X-axis direction moving unit 41 of the moving unit 40 via the X-axis direction moving plate 14. The rotation unit 13 and the holding table 10 are moved in the Y-axis direction by the Y-axis direction moving unit 42 of the moving unit 40 via the X-axis direction moving plate 14, the X-axis moving unit 41, and a Y-axis direction moving plate 15.

The laser beam application unit 20 applies the pulsed laser beam 21, which has a predetermined wavelength for processing the workpiece 100, to the workpiece 100 held on the holding table 10. In this embodiment, the laser beam application unit 20 is supported at a part thereof on a distal end of a support beam 4 that is attached at a proximal end thereof to an upright support wall 3 disposed upright from a machine main body 2. A description will be made subsequently about a detailed configuration of the laser beam application unit 20.

The moving unit 40 relatively moves the holding table 10 and a focal point 211 (see FIG. 3) of the laser beam 21 which is applied from the laser beam application unit 20. The moving unit 40 includes the X-axis direction moving unit 41 and the Y-axis direction moving unit 42.

The X-axis direction moving unit 41 relatively moves the holding table 10 and the focal point 211 (see FIG. 3) of the laser beam 21 which is applied from the laser beam application unit 20, in the X-axis direction, i.e., the processing feed direction. In this embodiment, the X-axis direction moving unit 41 moves the holding table 10 in the X-axis direction. The X-axis direction moving unit 41 is disposed on the machine main body 2 of the laser processing machine 1. The X-axis direction moving unit 41 supports the X-axis direction moving plate 14 movably in the X-axis direction.

The Y-axis direction moving unit 42 relatively moves the holding table 10 and the focal point 211 (see FIG. 3) of the laser beam 21 which is applied from the laser beam application unit 20, in the Y-axis direction, i.e., the indexing feed direction. In this embodiment, the Y-axis direction moving unit 42 moves the holding table 10 in the Y-axis direction. The Y-axis direction moving unit 42 is disposed on the machine main body 2 of the laser processing machine 1. The Y-axis direction moving unit 42 supports the Y-axis direction moving plate 15 movably in the Y-axis direction.

The X-axis direction moving unit 41 and the Y-axis direction moving unit 42 each include, for example, a known ball screw, a known pulse motor, and known guide rails. The ball screw is disposed rotatably about an axis of rotation. The pulse motor rotates the ball screw about the axis of rotation. The guide rails of the X-axis direction moving unit 41 are disposed fixedly on the Y-axis direction moving plate 15, and support the X-axis direction moving plate 14 movably in the X-axis direction. The guide rails of the Y-axis direction moving unit 42 are disposed fixedly on the machine main body 2, and support the Y-axis direction moving plate 15 movably in the Y-axis direction.

The display unit 50 is constituted of a liquid crystal display unit or the like. The display unit 50 displays, for example, a processing condition setting screen, conditions of the workpiece 100 imaged by an imaging unit (not illustrated), a status of processing operation, and the like on a display screen 51. If the display screen 51 of the display unit 50 includes a touch panel, the display unit 50 may include an input section. The input section can receive a variety of operation by an operator, including recording of information regarding processing details. The input section may be an external input device such as a keyboard. The display unit 50 is configured such that information or an image to be displayed on the display screen 51 can be switched over by operation through the input section or the like. The display unit 50 may include an alarm device. The alarm device emits at least one of a sound and light to notify the operator of the laser processing machine 1 of predetermined notification information. The alarm device may be an external alarm device such as a speaker or a flashing device.

The control unit 60 controls the above-mentioned individual components of the laser processing machine 1 individually or in combination to make the laser processing machine 1 perform processing operation on the workpiece 100. The control unit 60 is a computer that includes an arithmetic processing unit as arithmetic means, a storage device as storage means, and an input/output interface device as communication means. The arithmetic processing unit includes, for example, a microprocessor such as a central processing unit (CPU). The storage device has a memory such as a read only memory (ROM) or a random access memory (RAM). The arithmetic processing unit performs a variety of operations based on a predetermined program stored in the storage device. According to operation results, the arithmetic processing unit outputs various control signals to the above-mentioned individual elements via the input/output interface device, and performs control of the laser processing machine 1.

Figure 2:
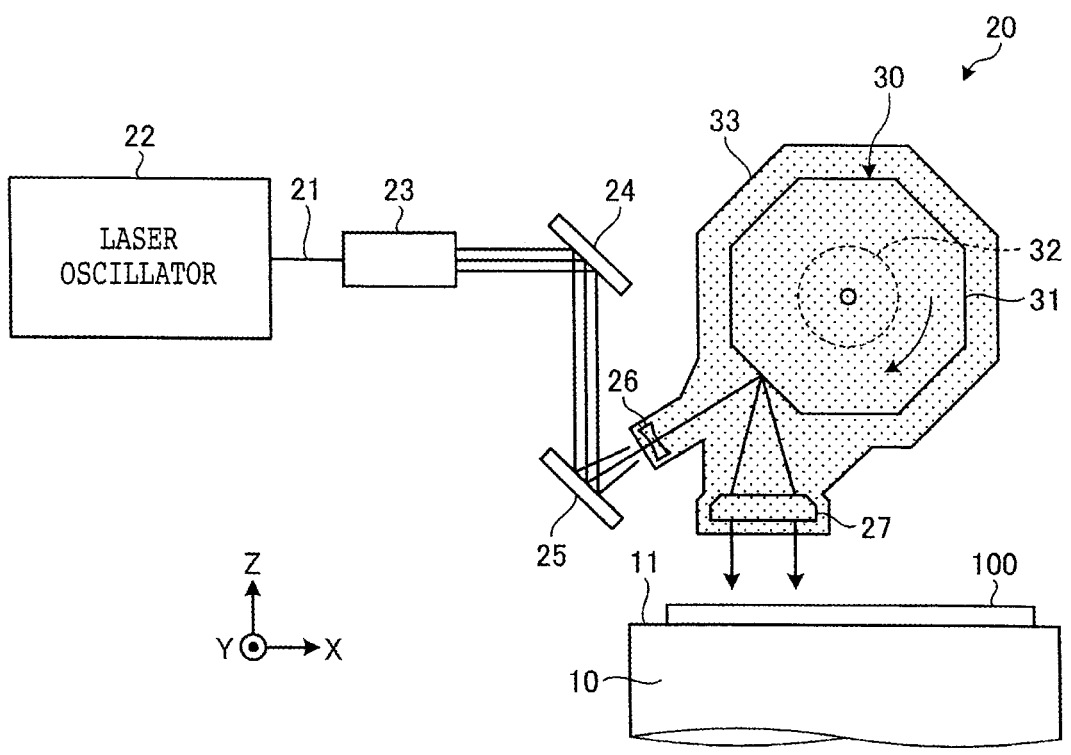
FIG. 2 is a schematic diagram illustrating an outline configuration of a laser beam application unit of the laser processing machine illustrated in FIG. 1.

The configuration of the laser beam application unit 20 will next be described in detail. FIG. 2 is a schematic diagram illustrating an outline configuration of the laser beam application unit 20 of the laser processing machine 1 illustrated in FIG. 1. As illustrated in FIG. 2, the laser beam application unit 20 has a laser oscillator 22, an acousto-optic deflector (AOD) 23, mirrors 24 and 25, an fθ sub-lens 26, an fθ main lens 27, a scan unit 30, and a chamber 33.

The laser oscillator 22 emits the laser beam 21 having the predetermined wavelength for processing the workpiece 100. The laser beam 21 emitted by the laser beam application unit 20 may be a laser beam of a wavelength having transmissivity for the workpiece 100, or a laser beam of a wavelength having absorptivity for the workpiece 100.

When applied with a predetermined high-frequency wave, the AOD 23 deflects an optical path of the laser beam 21 which has been emitted from the laser oscillator 22, in a predetermined direction (the Y-axis direction in this embodiment) to perform scanning. Corresponding to the frequency of the high-frequency wave applied, the AOD 23 adjusts an angle at which the optical path of the laser beam 21 is to be deflected. As a consequence, the laser beam 21 is scanned in the Y-axis direction.

The mirrors 24 and 25 are arranged on the optical path between the AOD 23 and the fθ sub-lens 26. The laser beam, which has been emitted from the laser oscillator 22 and has been deflected by the AOD 23, is propagated to the fθ sub-lens 26 by the mirrors 24 and 25.

The fθ sub-lens 26 is arranged on the optical path between the laser oscillator 22 and the fθ main lens 27. Described specifically, the fθ sub-lens 26 is arranged on the optical path between the mirror 25 and the scan unit 30. The laser beam 21 deflected by the AOD 23 is incident on the fθ sub-lens 26. The fθ sub-lens 26 converts the incident laser beam 21 from parallel light into diffused light. The fθ sub-lens 26 may be either a single lens or a combined lens.

The laser beam scanned by the scan unit 30 is incident on the fθ main lens 27. The fθ main lens 27 focuses the laser beam 21 emitted from the laser oscillator 22, and applies the resulting focused laser beam 21 on the workpiece 100 held on the holding table 10. The fθ main lens 27 is a combined lens consisting of multiple lenses in contact.

The scan unit 30 is arranged on the optical path between the laser oscillator 22 and the fθ main lens 27, scans the laser beam 21, and guides the resulting scanned laser beam 21 to the fθ main lens 27. In this embodiment, the scan unit 30 includes a polygon scanner. The scan unit 30 includes a scan mirror 31 and a scan motor 32.

The scan mirror 31 is disposed rotatably or swingably about an axis of rotation or swinging motion, the axis of rotation being parallel to the indexing feed direction (Y-axis direction). In this embodiment, the scan mirror 31 is arranged over individual side walls of a polygon (octagon in this embodiment) that rotates about the axis of rotation. The axis of rotation for the scan mirror 31 is held in place by a mirror holder (now illustrated). The fθ main lens 27 has a front focal point 271 (see FIG. 3) positioned on the scan mirror 31 on which the laser beam 21 from the fθ sub-lens 26 is incident in the scan unit 30. The scan motor 32 outputs a rotary drive force to rotate or swing the scan mirror 31 about the axis of rotation or swinging motion.

In the scan unit 30, the fθ main lens 27 reflects the laser beam 21, which has been converted into the diffused light by the fθ sub-lens 26, is reflected by the scan mirror 31 in a direction parallel to an XZ plane toward the fθ main lens 27, and the scan mirror 31 is rotated about the axis of rotation parallel to the Y-axis direction to make the laser beam 21 scan in the X-axis direction.

The chamber 33 accommodates the scan unit 30 disposed inside. In this embodiment, the fθ sub-lens 26 and the fθ main lens 27 are fixedly arranged on the chamber 33. The chamber 33 therefore has a function as a lens holder for the fθ sub-lens 26 and the fθ main lens 27. Owing to this configuration, the fθ sub-lens 26 and the fθ main lens 27 are incorporated as a unit with a relative distance therebetween and relative positions thereof fixed. Accordingly, the fθ sub-lens 26 and the fθ main lens 27 are incorporated as a unit with distances and positions thereof fixed relative to the scan unit 30. Further, the fθ sub-lens 26 and the fθ main lens 27 are each disposed in a form of a window that isolates an inside of the chamber 33 and a surrounding environment from each other while allowing transmission of the laser beam 21 therethrough.

Figure 3:
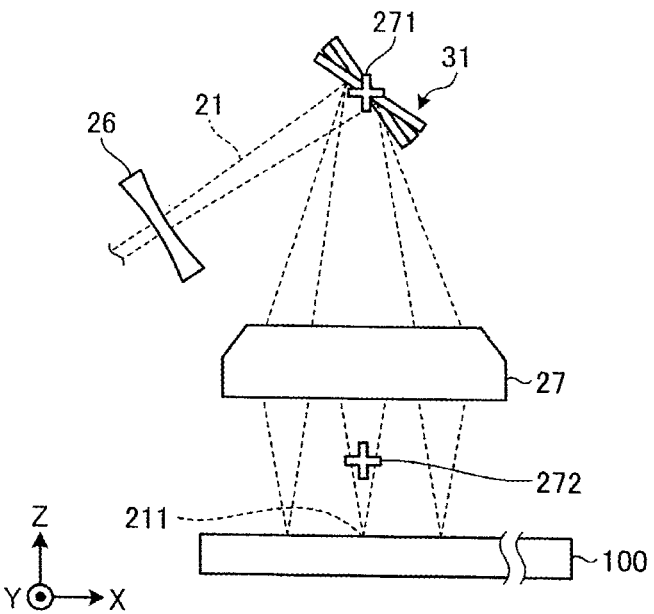
FIG. 3 is a schematic diagram illustrating examples of a front focal point and a back focal point of an fθ main lens in the laser beam application unit illustrated in FIG. 2.
Figure 4:
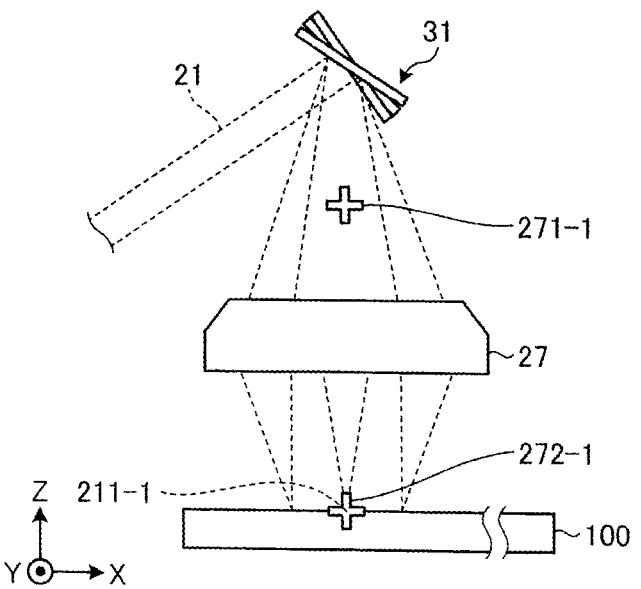
FIG. 4 is a schematic diagram of examples of a front focal point and a back focal point of the fθ main lens in a laser beam application unit of a comparative example.

A description will next be made about advantageous effects of the fθ sub-lens 26. FIG. 3 is a schematic diagram illustrating examples of the front focal point 271 and a back focal point 272 of the fθ main lens 27 in the laser beam application unit 20 illustrated in FIG. 2. FIG. 4 is a schematic diagram of examples of a front focal point 271-1 and a back focal point 272-1 of the fθ main lens 27 in a laser beam application unit of a comparative example.

In the laser beam application unit of the comparative example illustrated in FIG. 4, a laser beam 21 as parallel light is reflected on the scan mirror 31, and enters the fθ main lens 27. Therefore, the position of the back focal point 272-1 of the fθ main lens 27 is equal to the position of a focal point 211-1 of the laser beam 21.

In the laser beam application unit 20 of this embodiment illustrated in FIG. 3, on the other hand, the laser beam 21 which has been converted into the diffused light by the fθ sub-lens 26 is reflected on the scan mirror 31, and enters the fθ main lens 27. Therefore, the focal point 211 of the laser beam 21 is positioned at a location more remote from the fθ main lens 27 than the position of the back focal point 272 of the fθ main lens 27.

In the comparative example illustrated in FIG. 4, that is, in a case where the laser beam 21 as the parallel light enters, the distance from the fθ main lens 27 to the front focal point 271-1 and the distance from the fθ main lens 27 to the back focal point 272-1 are equal. On the other hand, the distance from the fθ main lens 27 to the front focal point 271 in this embodiment illustrated in FIG. 3 is longer than the distance from the fθ main lens 27 to the front focal point 271-1 (see FIG. 4) in the case where the laser beam as the parallel light enters.

Here, the front focal point 271 of the fθ main lens 27 needs to be positioned on the scan mirror 31 on which the laser beam 21 from the fθ sub-lens 26 is incident, to make the laser beam 21 incident vertically on the workpiece 100. In order to make the laser beam 21 vertically incident on the workpiece 100 in the laser beam application unit of the comparative example illustrated in FIG. 4, the distance between the scan mirror 31 and the fθ main lens 27 therefore needs to be made smaller than that illustrated in FIG. 4. If the distance between the scan mirror 31 and the fθ main lens 27 is made smaller, however, the fθ main lens 27 may be affected and vibrated by high-speed rotation of the scan unit 30.

In the laser beam application unit 20 of this embodiment illustrated in FIG. 3, on the other hand, the distance between the focal point 211 of the laser beam 21, the focal point 211 being positioned at a processing point on the workpiece 100, and the fθ main lens 27 can be set greater than the distance between the fθ main lens 27 and the back focal point 272 owing to the inclusion of the fθ sub-lens 26 that converts the laser beam 21 which is to be incident on the scan mirror 31 of the scan unit 30, into the diffused light. In the laser beam application unit 20, the inclusion of the fθ sub-lens 26 also obviates consideration of the position of the back focal point 272 of the fθ main lens 27, whereby the design freedom is improved to enable increasing the distance of the front focal point 271 of the fθ main lens 27.

As described above, the laser processing machine 1 of this embodiment can focus the laser beam 21 on a rear side than the position (the back focal point 272) where the laser beam 21 would be focused if it were incident as parallel light, by making the laser beam 21 incident on the fθ main lens 27 in a diffused form through the fθ sub-lens 26. As a consequence, the distance from the fθ main lens 27 to the processing point can be set large. Further, it has become no longer necessary to take into consideration the position of the back focal point 272 of the fθ main lens 27. Therefore, the design freedom for the fθ main lens 27 has been improved to enable separating the front focal point 271 of the fθ main lens 27 from the fθ main lens 27.

The front focal point 271 of the fθ main lens 27 can therefore be positioned on the scan mirror 31 even if the scan mirror 31 and the front focal point 271 of the fθ main lens 27 are arranged at positions sufficiently separated from each other to keep the fθ main lens 27 unaffected by high-speed rotation of the scan mirror 31. It is hence possible to make the laser beam 21 incident vertically on the workpiece 100 while minimizing upsizing of the entire machine and suppressing smearing of the fθ main lens 27 with debris.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing machine comprising:
a holding table that holds a workpiece thereon;
a laser beam application unit that applies processing to the workpiece by focusing and applying a pulsed laser beam to the workpiece held on the holding table; and a moving unit that relatively moves the holding table and a focal point of the laser beam,
wherein the laser beam application unit includes:
a laser oscillator that emits the laser beam,
an fθ main lens that focuses and applies the laser beam which has been emitted from the laser oscillator, to the workpiece held on the holding table, wherein the fθ main lens defines a front focal point and a back focal point,
a scan unit that is arranged on an optical path between the laser oscillator and the fθ main lens, scans the laser beam, and guides the resulting scanned laser beam to the fθ main lens, and
an fθ sub-lens that is arranged on the optical path between the laser oscillator and the scan unit and converts the laser beam from parallel light into diffused light, and
wherein the scan unit includes a scan mirror with a reflecting surface on which the laser beam is incident from the fθ sub-lens, and the front focal point of the fθ main lens is positioned on the reflecting surface of the scan mirror, and
further wherein a distance between the focal point of the laser beam, that has passed through the fθ main lens, at a processing point on the workpiece and the fθ main lens is greater than a distance between the back focal point of the fθ main lens and the fθ main lens, and wherein a distance between the front focal point of the fθ main lens and the fθ main lens is greater than a distance between the back focal point of the fθ main lens and the fθ main lens.

2. The laser processing machine according to claim 1, wherein the fθ main lens and the fθ sub-lens are incorporated as a unit with distances and positions thereof fixed relative to the scan unit.

3. The laser processing machine according to claim 1, wherein:
the laser beam application unit includes a chamber,
the scan unit is disposed within the chamber, and
the fθ main lens and the fθ sub-lens are each disposed in a form of a window that isolates an inside of the chamber and a surrounding environment from each other while allowing transmission of the laser beam therethrough.

4. The laser processing machine according to claim 1, wherein the scan unit also comprises:
a scan motor for rotating the scan mirror, and
wherein the scan mirror of the scan unit is of a polygon shape that is configured and arranged to be rotated about an axis of rotation by the scan motor.

5. The laser processing machine according to claim 4 wherein the polygon shape of the scan mirror is an octagon, and further wherein the reflecting surface of the scan mirror comprises an outer periphery of the polygon shape.

6. The laser processing machine according to claim 4 wherein the reflecting surface of the scan mirror comprises an outer periphery of the polygon shape.

\* \* \* \* \*